United States Patent
Liu et al.

(10) Patent No.: US 10,199,397 B2
(45) Date of Patent: Feb. 5, 2019

(54) ELECTRICAL CONNECTION STRUCTURE, ARRAY SUBSTRATE AND DISPLAY DEVICE

(71) Applicants: BOE Technology Group Co., Ltd., Beijing (CN); HEFEI Xinsheng Optoelectronics Technology Co., Ltd., Hefei (CN)

(72) Inventors: Liping Liu, Beijing (CN); Wenxiang Yin, Beijing (CN); Yu Ai, Beijing (CN); Junqi Han, Beijing (CN)

(73) Assignees: BOE Technology Group Co., Ltd., Beijing (CN); Hefei Xinsheng Optoelectronics Technology Co., Ltd., Hefei (CN)

(*) Notice: Subject to any disclaimer, the term of this patent is extended or adjusted under 35 U.S.C. 154(b) by 155 days.

(21) Appl. No.: 15/127,139

(22) PCT Filed: Dec. 22, 2015

(86) PCT No.: PCT/CN2015/098268
§ 371 (c)(1),
(2) Date: Sep. 19, 2016

(87) PCT Pub. No.: WO2017/016153
PCT Pub. Date: Feb. 2, 2017

(65) Prior Publication Data
US 2018/0175065 A1    Jun. 21, 2018

(30) Foreign Application Priority Data

Jul. 28, 2015 (CN) .................... 2015 2 0566486 U

(51) Int. Cl.
*H01L 27/12* (2006.01)
*G02F 1/1345* (2006.01)
(Continued)

(52) U.S. Cl.
CPC .......... *H01L 27/124* (2013.01); *G02F 1/1345* (2013.01); *G02F 1/136286* (2013.01);
(Continued)

(58) Field of Classification Search
None
See application file for complete search history.

(56) References Cited

U.S. PATENT DOCUMENTS 9,853,064 B2 * 12/2017 Li ..................... H01L 27/1244
9,893,090 B2 *  2/2018 Kim ..................... H01L 27/124
(Continued)

FOREIGN PATENT DOCUMENTS

CN       101907791 A     12/2010
CN       202710888 U      1/2013
(Continued)

OTHER PUBLICATIONS

Feb. 24, 2016—(WO) Written Opinion of ISA—Intl App PCT/CN2015/098268 (with English Translation).
(Continued)

*Primary Examiner* — Michael Lebentritt
(74) *Attorney, Agent, or Firm* — Banner & Witcoff, Ltd.

(57) ABSTRACT

An electrical connection structure, an array substrate and a display device. The electrical connection structure includes a first electrical connection component, which includes: a conductive structure; an insulating layer covering the conductive structure, where at least one first via hole and at least one second via hole are disposed separately in the insulating layer, each first via hole and each second via hole expose a respective part of a surface of the conductive structure; and a conductive connection layer disposed on the insulating layer and covering the at least one first via hole and the at least one second via hole, where the conductive connection layer and the conductive structure are electrically connected (Continued)

with each other through the at least one first via hole and the at least one second via hole. The electrical connection structure can reduce undercut phenomena that occur at via holes in the insulating layer.

18 Claims, 2 Drawing Sheets

(51) Int. Cl.
*G02F 1/1362* (2006.01)
*G02F 1/155* (2006.01)
*H05K 1/18* (2006.01)

(52) U.S. Cl.
CPC ............. *G02F 1/155* (2013.01); *H05K 1/189* (2013.01); *H05K 2201/05* (2013.01)

(56) References Cited

U.S. PATENT DOCUMENTS

| | | | |
|---|---|---|---|
| 9,947,835 B2* | 4/2018 | Seo | H01L 33/46 |
| 2008/0117558 A1* | 5/2008 | Shih | G02F 1/136204 |
| | | | 361/117 |
| 2011/0198602 A1* | 8/2011 | Nanbu | C23C 14/18 |
| | | | 257/59 |
| 2012/0235138 A1* | 9/2012 | Shieh | H01L 27/1225 |
| | | | 257/43 |
| 2014/0091291 A1* | 4/2014 | Niu | H01L 27/3276 |
| | | | 257/40 |
| 2014/0103348 A1* | 4/2014 | Gai | H01L 27/124 |
| | | | 257/59 |
| 2015/0123136 A1* | 5/2015 | Kim | G02F 1/13454 |
| | | | 257/72 |
| 2015/0185513 A1* | 7/2015 | Wu | G02F 1/134363 |
| | | | 257/72 |
| 2015/0206903 A1* | 7/2015 | Gao | G02F 1/1368 |
| | | | 257/72 |
| 2016/0027812 A1* | 1/2016 | Kim | H01L 21/76831 |
| | | | 257/43 |
| 2016/0049425 A1* | 2/2016 | Kim | H01L 27/124 |
| | | | 257/72 |
| 2016/0117039 A1* | 4/2016 | Zhao | G06F 3/0416 |
| | | | 345/173 |
| 2016/0147123 A1* | 5/2016 | Cheng | G02F 1/134363 |
| | | | 257/72 |
| 2016/0202551 A1* | 7/2016 | Lee | G02F 1/133528 |
| | | | 349/42 |
| 2016/0247821 A1* | 8/2016 | Li | H01L 29/78642 |
| 2016/0327841 A1* | 11/2016 | Jia | G02F 1/133 |
| 2016/0328058 A1* | 11/2016 | Peng | G06F 3/0412 |
| 2016/0351596 A1* | 12/2016 | Liao | H01L 27/1222 |
| 2017/0012059 A1* | 1/2017 | Zhang | H01L 27/3279 |
| 2017/0052418 A1* | 2/2017 | Zhang | G02F 1/136227 |
| 2017/0186784 A1* | 6/2017 | Yang | H01L 27/1288 |
| 2017/0213852 A1* | 7/2017 | Li | H01L 27/124 |
| 2017/0307919 A1* | 10/2017 | Wang | G02F 1/1368 |
| 2018/0090378 A1* | 3/2018 | Lu | H01L 21/77 |

FOREIGN PATENT DOCUMENTS

| | | |
|---|---|---|
| CN | 102998869 A | 3/2013 |
| JP | 2008015373 A | 1/2008 |

OTHER PUBLICATIONS

Feb. 24, 2016—International Search Report—Intl App PCT/CN2015/098268 (with English Translation).

* cited by examiner

ELECTRICAL CONNECTION STRUCTURE, ARRAY SUBSTRATE AND DISPLAY DEVICE

The application is a U.S. National Phase Entry of International Application No. PCT/CN2015/098268 filed on Dec. 22, 2015, designating the United States of America and claiming priority to Chinese Patent Application No. 201520566486.5 filed on Jul. 28, 2015. The present application claims priority to and the benefit of the above-identified applications and the above-identified applications are incorporated by reference herein in their entirety.

TECHNICAL FIELD

At least one embodiment of the present disclosure relates to an electrical connection structure, an array substrate and a display device.

BACKGROUND

With the rapid development of display technology, display devices have been spread throughout the life of people gradually.

A liquid crystal display device is one of mainstream display devices. The liquid crystal display device comprises an array substrate and an opposite substrate (for example, a color filter substrate) disposed opposite to each other, and a liquid crystal layer disposed between the array substrate and the opposite substrate. The array substrate is provided with a display area, and a driving component, for example, a driving IC (Integrated Circuit), is disposed outside the display area of the array substrate. The driving component can be disposed on the array substrate, or it can also be disposed outside the array substrate and connected with the array substrate through, for instance, a flexible printed circuit board. A plurality of signal lines (for example, gate lines and data lines that extend across with each other) are disposed on the array substrate. These signal lines extend from the display area of the array substrate and are usually electrically connected with the flexible printed circuit board disposed outside the display area, to achieve signal transmission between the array substrate and the driving component.

SUMMARY

At least one embodiment of the present disclosure provides an electrical connection structure, an array substrate and a display device. In the premise of ensuring low resistance, the risk of signal transmission disconnection between the conductive structure and other component caused by an undercut at a via hole in the insulating layer is reduced.

At least one embodiment of the present disclosure provides an electrical connection structure. The electrical connection structure comprises a first electrical connection component. The first electrical connection component comprises a conductive structure; an insulating layer covering the conductive structure, where at least one first via hole and at least one second via hole are disposed separately in the insulating layer, each first via hole and each second via hole expose a respective part of a surface of the conductive structure respectively; along the surface where the insulating layer is disposed, an opening size of each first via hole is larger than an opening size of each second via hole; and a conductive connection layer disposed on the insulating layer and covering the at least one first via hole and the at least one second via hole, where the conductive connection layer and the conductive structure are electrically connected with each other through the at least one first via hole and the at least one second via hole.

At least one embodiment of the present disclosure further provides an array substrate comprising the electrical connection structure mentioned above.

At least one embodiment of the present disclosure further provides a display device comprising the array substrate mentioned above.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

Figure 1A:
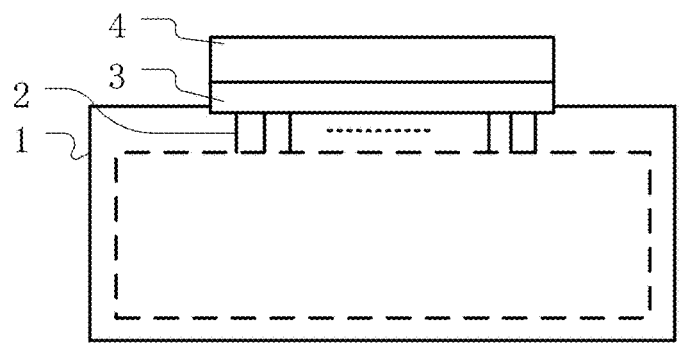
FIG. 1a is a connection schematic view of an array substrate and a driving component.

FIG. 1a is a connection schematic view of an array substrate and a driving component. As shown in FIG. 1a, an array substrate 1 and a driving component 4 are connected through a flexible printed circuit board 3. A plurality of signal lines 2 extending from a display area (a dashed box as shown in FIG. 1a) of the array substrate 1 are electrically connected with the flexible printed circuit board 3.

Figure 1B:
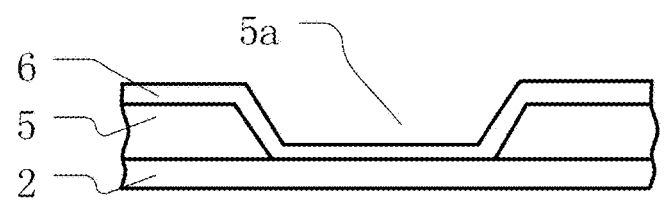
FIG. 1b is a cross-sectional schematic view of a part of a signal line that is disposed outside the array substrate.

FIG. 1b is a cross-sectional schematic view of a part of a signal line, which is disposed outside the array substrate. As shown in FIG. 1b, a non-metal layer 5 (for example, formed from an insulating material) is disposed on the signal line 2. The non-metal layer 5 is used for preventing the signal line 2 from being oxidized. A via hole 5a exposing part of a surface of the signal line 2 is disposed in the non-metal layer 5. A conductive connection layer 6 (for example, formed from a transparent metal oxide material) is disposed on the non-metal layer 5. The conductive connection layer 6 covers the via hole 5a in the non-metal layer 5 to prevent the part of the surface of the signal line 2 that is exposed by the via hole 5a from being oxidized. The conductive connection layer 6 is electrically connected with the driving component 4 (not shown in FIG. 1b) and is electrically connected with the signal line 2 through the via hole 5a. Thus, the driving component 4 and the signal line 2 are electrically connected together.

In research, the inventors of the present application noticed that the conductive connection layer 6 and a transparent electrode on the array substrate are usually disposed in a same layer, and the conductive connection layer 6 is commonly formed from a transparent metal oxide material (for example, indium tin oxide) or the like. Due to the resistivity of the transparent metal oxide material is large, the size of the via hole 5a in the non-metal layer 5 is large, so as to increase the contact area of the conductive connection layer 6 and the signal line 2 as much as possible, and thus to reduce the resistance of the conductive connection layer 6 as much as possible. Because there are many high temperature processes in the fabricating process of the display device and the inconsistency of thermal expansion and contraction of the signal line 2, the non-metal layer 5 disposed on the signal line 2 and the conductive connection layer 6, a undercut is prone to occur at the via hole 5a; that is, the conductive connection layer 6 breaks easily at the stair of the via hole 5a. And due to the stress, the signal line 2 also breaks easily at the stair of the via hole 5a where the signal line 2 and the conductive connection layer 6 contact with each other, which results in the disconnection of the signal transmission between the flexible printed circuit board and the array substrate. Thus, an open circuit is formed, and thus, abnormal phenomena such as bright line and abnormal light occur.

Figure 2A:
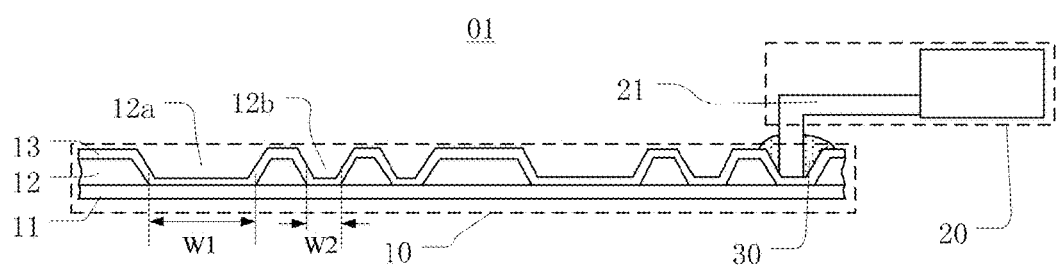
FIG. 2a is a cross-sectional schematic view of an electrical connection structure according to an embodiment of the present disclosure.
Figure 2B:
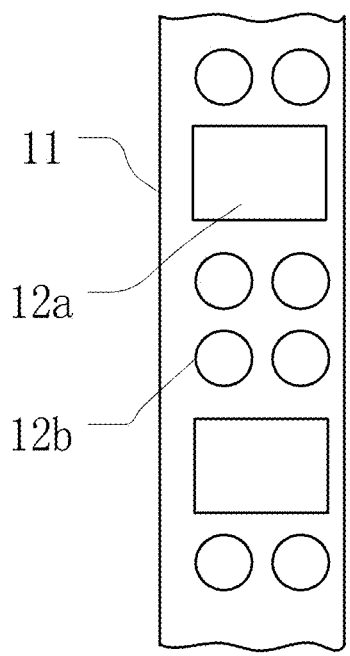
FIG. 2b is a top schematic view of a first electrical connection component of the electrical connection structure according to an embodiment of the present disclosure.

At least one embodiment of the present disclosure provides an electrical connection structure 01. As shown in FIG. 2a and FIG. 2b, the electrical connection structure 01 comprises a first electrical connection component 10. The first electrical connection component 10 comprises a conductive structure 11, an insulating layer 12 covering the conductive structure 11 and a conductive connection layer 13 disposed on the insulating layer 12. At least one first via hole 12a and at least one second via hole are disposed separately in the insulating layer 12; each first via hole 12a and each second via hole 12b expose part of a surface of the conductive structure 11 respectively. Along the surface where the insulating layer 12 is disposed, an opening size W1 of the first via hole 12a is larger than an opening size W2 of the second via hole 12b. The conductive connection layer 13 disposed on the insulating layer 12 covers the at least one first via hole 12a and the at least one second via hole 12b; and the conductive connection layer 13 and the conductive structure 11 are electrically connected together through the at least one first via hole 12a and the at least one second via hole 12b.

It should be noted that, the conductive structure 11 can be a conductive structure of any shape (for example, a line shape or plate shape). Besides, the arrangement of the first via hole and the second via hole is not limited in embodiments of the present disclosure; and the first via hole and the second via hole can be arranged in any mode.

In an embodiment of the present disclosure, the insulating layer 12 disposed on the conductive structure 11 can protect part of the surface of the conductive structure 11; and the conductive connection layer 13 can protect part of the surface of the conductive structure 11 exposed by the first via hole 12a and the second via hole 12b in the insulating layer 12. Through disposing the first via hole 12a with a large opening size, a contact area between the conductive connection layer 13 and the conductive structure 11 is large, and thus this configuration can ensure the resistance of the conductive connection layer 13 is small. In an embodiment of the present disclosure, a contact area between the conductive connection layer 6 and the conductive structure 11 at a location where the second via hole with a small opening size is disposed is small; thus, a distance difference caused by the thermal expansion and contraction is small, and a undercut does not easily occur at the second via hole. Therefore, in the premise of ensuring the electrical connection, compared with a mode that applies a plurality of via holes of a same large size, in a mode that applies a combination of the first via hole with a large opening size and the second via hole with a small opening size according to the embodiments of the present disclosure, the second via hole with a small opening size can reduce the risk of undercut caused by the inconsistency of thermal expansion and contraction of different materials disposed in different layers, can reduce the risk of undercut at the via hole disposed in the insulating layer 12 that is disposed on the conductive structure 11, and thus can reduce the risk of signal transmission disconnection. Furthermore, through disposing the second via hole 12b with a small opening size, because the total amount of the via holes in the insulating layer 12 is increased, the risk of signal transmission disconnection between the conductive structure and other component (for example, driving component) caused by the undercut at the via hole disposed in the insulating layer 12 is decreased when compared with the mode disposing one via hole exposing a surface of the conductive structure on the conductive structure.

That is to say, the embodiments are suitable for the electrical connection structure 01 in which the conductive structure 11 can be protected by the insulating layer 12 and the conductive connection layer 13, and the resistance of the conductive connection layer 13 is reduced with the increasing of the contact area between the conductive connection layer 13 and the conductive structure 11. For example, the material of the conductive structure 11 comprises a metal; and the material of the conductive connection layer 13 comprises a conductive metal oxide material.

In at least one embodiment, a ratio range of a size of the second via hole 12b and a size of the first via hole 12a is from 1:100 to 1:2. This configuration not only can ensure the low resistance of the conductive connection layer 13, but also can reduce the risk of signal transmission disconnection between the conductive structure 11 and other component caused by the undercut at the via hole disposed in the insulating layer.

In at least one embodiment, a ratio range of a quantity of the first via holes 12a and a quantity of the second via holes 12b is from 1:100 to 1:1. In the embodiment, the quantity of the first via holes 12a that have a large opening size is less than the quantity of the second via holes 12b that have a small opening size. This configuration facilitates arrangement of locations of the first via hole 12a and the second via hole 12b, and in the premise that the total number of via holes is fixed, the risk of signal transmission disconnection between the conductive structure 11 and other component caused by the undercut is lowered compared with a mode that the quantity of the first via holes is greater than the quantity of the second via holes.

In an embodiment of the present disclosure, a shape of the first via hole 12a at the surface where the insulating layer 12 is disposed can be any shape such as a polygon, a circle or an oval.

In an embodiment of the present disclosure, a shape of the second via hole 12b at the surface where the insulating layer 12 is disposed, can be any shape such as a polygon, a circle or an oval.

In FIG. 2b, the shape of the first via hole 12a is a quadrangle, and the shape of the second via hole 12b is a circle, which is illustrated by way of examples. Embodiments of the present disclosure comprise but are not limited to this configuration.

As shown in FIG. 2a, the electrical connection structure 01 according to at least one embodiment of the present disclosure further comprises a second electrical connection component 20. The second electrical connection component 20 comprises a conductive coupling portion 21. The conductive coupling portion 21 is electrically connected with the conductive connection layer 13 of the first electrical connection component 10 so that the second electrical connection component 20 and the conductive structure 11 of first electrical connection component 10 are electrically connected with each other.

In an embodiment of the present disclosure, the conductive coupling portion 21 of the second electrical connection component 20 and the conductive connection layer 13 of the first electrical connection component 10 can be electrically connected with each other through any way. For example, the conductive coupling portion 21 and the conductive connection layer 13 can be electrically connected with each other through the first via hole 12a and/or the second via hole 12b. This configuration can avoid the influence on the conductive connection layer that is caused by application of a material with a large resistivity such as a metal oxide. Of course, the conductive coupling portion 21 can be electrically connected with a part of the conductive connection layer 13 that is located outside the first via hole 12a and the second via hole 12b. It should be noted that, FIG. 2a and FIG. 2b show only one conductive structure 11. In a situation with a plurality of conductive structures, conductive connection layers that are electrically connected with the conductive structures respectively are separated from each other to avoid electrically connection between the conductive structures.

In at least one embodiment, the conductive coupling portion 21 and the conductive connection layer 13 can be electrically connected with each other through a conductive adhesive 30, as shown in FIG. 2a. In this configuration, the conductive coupling portion 21 and the conductive connection layer 13 can be sufficiently contacted with each other.

And in a case that the conductive coupling portion 21 extends to the first via hole or the second via hole and the conductive adhesive 30 is disposed in the corresponding via hole, even if a undercut occurs in this via hole, the conductive adhesive 30 can also implement electrical connection between the conductive coupling portion 21 and the conductive connection layer 13. Thus, the risk of signal transmission disconnection between the conductive structure and other component caused by the undercut at the via hole in the insulating layer is further reduced.

It should be noted that, the conductive adhesive 30 can be instilled to the via hole in a conventional way in the art, which is not repeated in embodiments of the present disclosure.

For example, the second electrical connection component 20 can be a flexible printed circuit board or a driving component, for example, a driving IC.

If the second electrical connection component 20 is a flexible printed circuit board or a driving component, the conductive coupling portion 21 of the second electrical connection component 20 can be, for instance, an electrode pin.

At least one embodiment of the present disclosure further provides an array substrate 02 comprising the electrical connection structure 01 according to any one of the embodiments mentioned above.

Figure 3:
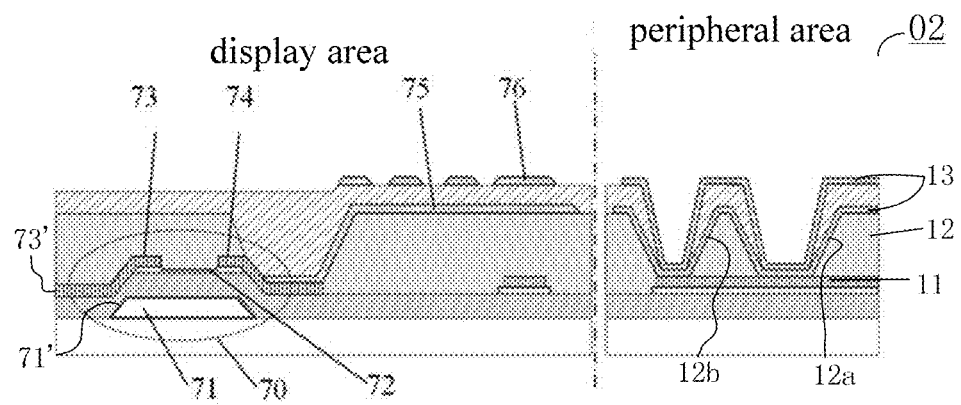
FIG. 3 is a cross-sectional schematic view of parts of an array substrate according to an embodiment of the present disclosure.

FIG. 3 is a cross-sectional schematic view of parts of an array substrate according to an embodiment of the present disclosure. As shown in FIG. 3, the array substrate 02 is provided with a display area. The first via hole 12a and the second via hole 12b in the insulating layer 12 are disposed outside the display area (i.e., disposed in the peripheral area). Because signal lines such as gate lines and data lines on the array substrate extend from the display area and are electrically connected with the flexible printed circuit board or the driving component at the peripheral area, the undercut caused by the inconsistency of thermal expansion and contraction of different materials disposed in different layers is prone to occur in the peripheral area. Therefore, disposing the first via hole and the second via hole with different opening sizes in the insulating layer 12 at the peripheral area can reduce the risk that the undercut occurs at via holes between different materials disposed in different layers.

A metal layer (for example, a gate metal layer 71' of a thin film transistor 70 where the gate electrode 71 is disposed, or a source/drain metal layer 73' where a source electrode 73 and a drain electrode 74 are disposed) is disposed in the display area of the array substrate 02. In at least one embodiment, the conductive structure 11 of the electrical connection structure 01 and the metal layer disposed in the display area can be disposed in a same layer. For example, the material in the peripheral area used for forming the gate electrode 71 can be reserved to form the conductive structure 11 in the process when the gate electrode 71 is formed in the display area. In this case, the conductive structure 11, for instance, is a gate line or a gate line contact pad. Or, for example, the material in the peripheral area used for forming the source electrode 73 and the drain electrode 74 can be reserved to form the conductive structure 11 in the process when the source electrode 73 and the drain electrode 74 are formed in the display area. In this case, the conductive structure 11, for instance, is a data line or a data line contact pad. Or, the conductive structure, for instance, is a common electrode line or a common electrode contact pad.

Commonly, one or more transparent electrode layers are disposed in the display area of the array substrate 02. By taking an array substrate of a liquid display device as an example, a pixel electrode 75 or a pixel electrode 75 and a common electrode 76 are disposed in the array substrate. In this configuration, the one or more transparent electrode layers can be a layer where the pixel electrode 75 is disposed or layers where the pixel electrode 75 and the common electrode 76 are disposed.

In at least one embodiment, the conductive connection layer 13 of the electrical connection structure comprises a part that is disposed in a same layer with the transparent electrode layer or a part that is disposed on at least one layer of the one or more transparent electrode layers. For example, the material in the peripheral area used for forming the pixel electrode 75 can be reserved to form the conductive connection layer 13 in the process when the pixel electrode 75 is formed in the display area. Or, for example, the materials in the peripheral area used for forming the pixel electrode 75 and the common electrode 76 can be reserved respectively to form the conductive connection layer 13 in the process when the pixel electrode 75 and the common electrode 76 are formed in the display area.

It should be noted that, the structure of the thin film transistor 70 in the array substrate 02 and the position relationship of the pixel electrode 75 and the common electrode 76 are not limited in embodiments of the present disclosure. That is to say, in the thin film transistor 70, the gate electrode 71 can be disposed above or under the active layer 72; the source electrode 73 and the drain electrode 74 can be disposed under or above the active layer 72; and the pixel electrode 75 and the common electrode 76 can be disposed in a same layer or disposed in different layers (the pixel electrode 75 can be disposed above or under the common electrode 76). The array substrate according to embodiments of the present disclosure can be an array substrate of another type such as an OLED (Organic Light-Emitting Diode) array substrate and the like, as long as it includes the electrical connection structure according to any one of the embodiments mentioned above.

At least one embodiment of the present disclosure further provides a display device comprising the array substrate according to any one of the embodiments mentioned above.

For example, the display device can be any product or component having a display function such as liquid crystal display panel, electronic paper, OLED panel, mobile phone, tablet computer, television, display screen, laptop computer, digital photo frame, navigator or the like.

What are described above is related to the illustrative embodiments of the disclosure only and not limitative to the scope of the disclosure. Therefore, the scopes of the disclosure are defined by the accompanying claims.

The present application claims the priority of the Chinese Patent Application No. 201520566486.5 filed on Jul. 28, 2015, which is incorporated herein in its entirety by reference as part of the disclosure of the present application.

What is claimed is:

1. An electrical connection structure, comprising:
   a first electrical connection component, wherein the first electrical connection component comprises:
      a conductive structure;
      an insulating layer covering the conductive structure, wherein at least one first via hole and at least one second via hole are disposed separately in the insulating layer, each first via hole and each second via hole expose a respective part of a surface of the conductive structure respectively; along a surface where the insulating layer is disposed, an opening size of each first via hole is larger than an opening size of each second via hole; and
      a conductive connection layer disposed on the insulating layer and covering the at least one first via hole and the at least one second via hole, wherein the conductive connection layer and the conductive structure are electrically connected with each other through the at least one first via hole and the at least one second via hole; and
   a second electrical connection component, wherein:
      the second electrical connection component comprises a conductive coupling portion, and
      the conductive coupling portion of the second electrical connection component and the conductive connection layer of the first electrical connection component are electrically connected with each other so as to electrically connect the second electrical connection component with the conductive structure of the first electrical connection component.

2. The electrical connection structure according to claim 1, wherein material of the conductive structure comprises a metal; and material of the conductive connection layer comprises a conductive metal oxide material.

3. The electrical connection structure according to claim 1, wherein a ratio range of a quantity of the first via holes and a quantity of the second via holes is from 1:100 to 1:1.

4. The electrical connection structure according to claim 1, wherein a ratio range of a size of each second via hole and a size of each first via hole is from 1:100 to 1:2.

5. The electrical connection structure according to claim 1, wherein,
   at the surface where the insulating layer is disposed, a shape of each first via hole and/or a shape of each second via hole comprises a polygon, a circle or an oval.

6. The electrical connection structure according to claim 1, wherein the second electrical connection component is a flexible printed circuit board or a driving component.

7. The electrical connection structure according to claim 1, wherein the conductive coupling portion of the second electrical connection component and the conductive connection layer of the first electrical connection component are electrically connected with each other through a conductive adhesive.

8. An array substrate, comprising the electrical connection structure according to claim 1.

9. The array substrate according to claim 8, wherein the array substrate is provided with a display area, and the at least one first via hole and the at least one second via hole are disposed outside the display area.

10. The array substrate according to claim 8, wherein,
    the array substrate is provided with a display area, a metal layer is disposed in the display area, and the conductive structure of the electrical connection structure and the metal layer are disposed in a same layer.

11. The array substrate according to claim 8, wherein,
    the array substrate is provided with a display area, one or more transparent electrode layers are disposed in the display area; the conductive connection layer of the electrical connection structure comprises a part that is disposed in at least one layer of the one or more transparent electrode layers.

12. A display device, comprising the array substrate according to claim 8.

13. The array substrate according to claim 8, wherein,
    the array substrate is provided with a display area, a transparent electrode layer is disposed in the display area; the conductive connection layer of the electrical connection structure comprises a part that is disposed in a same layer with the transparent electrode layer.

14. The electrical connection structure according to claim 2, wherein a ratio range of a quantity of the first via holes and a quantity of the second via holes is from 1:100 to 1:1.

15. The electrical connection structure according to claim 2, wherein a ratio range of a size of each second via hole and a size of each first via hole is from 1:100 to 1:2.

16. The electrical connection structure according to claim 2, wherein,
at the surface where the insulating layer is disposed, a shape of each first via hole and/or a shape of each second via hole comprises a polygon, a circle or an oval.

17. The electrical connection structure according to claim 3, wherein a ratio range of a size of each second via hole and a size of each first via hole is from 1:100 to 1:2.

18. The electrical connection structure according to claim 3, wherein,
at the surface where the insulating layer is disposed, a shape of each first via hole and/or a shape of each second via hole comprises a polygon, a circle or an oval.

\* \* \* \* \*